US008947338B2

(12) United States Patent
Miyamoto et al.

(10) Patent No.: US 8,947,338 B2
(45) Date of Patent: Feb. 3, 2015

(54) DRIVING CIRCUIT AND DISPLAY DEVICE USING MULTIPLE PHASE CLOCK SIGNALS

(75) Inventors: Motoharu Miyamoto, Mobara (JP); Takahiro Ochiai, Chiba (JP)

(73) Assignee: Japan Display Inc., Tokyo (JP)

( * ) Notice: Subject to any disclaimer, the term of this patent is extended or adjusted under 35 U.S.C. 154(b) by 123 days.

(21) Appl. No.: 13/604,775

(22) Filed: Sep. 6, 2012

(65) Prior Publication Data

US 2013/0057525 A1 Mar. 7, 2013

(30) Foreign Application Priority Data

Sep. 6, 2011 (JP) ................................ 2011-193730

(51) Int. Cl.
*G09G 3/36* (2006.01)
*G11C 19/00* (2006.01)

(52) U.S. Cl.
CPC ...... *G09G 3/3677* (2013.01); *G09G 2310/0281* (2013.01)
USPC ............................................ 345/100; 377/64

(58) Field of Classification Search
CPC .................................................. G09G 3/3674
USPC ......................................................... 345/100
See application file for complete search history.

(56) References Cited

U.S. PATENT DOCUMENTS

| | | | | |
|---|---|---|---|---|
| 5,859,630 A * | 1/1999 | Huq | 345/100 |
| 7,932,888 B2 * | 4/2011 | Miyake | 345/100 |
| 2005/0156856 A1 * | 7/2005 | Jang et al. | 345/100 |
| 2006/0139292 A1 * | 6/2006 | Yoon et al. | 345/100 |
| 2006/0145999 A1 * | 7/2006 | Cho et al. | 345/100 |
| 2006/0269038 A1 * | 11/2006 | Jang et al. | 377/64 |
| 2007/0070020 A1 | 3/2007 | Edo et al. | |
| 2008/0001627 A1 * | 1/2008 | Lee et al. | 345/100 |
| 2010/0316182 A1 * | 12/2010 | Lai | 377/79 |
| 2011/0255653 A1 * | 10/2011 | Chae | 377/64 |

FOREIGN PATENT DOCUMENTS

JP 2007-95190 4/2007

* cited by examiner

*Primary Examiner* — Adam J Snyder
(74) *Attorney, Agent, or Firm* — Antonelli, Terry, Stout & Kraus, LLP.

(57) ABSTRACT

In a driving circuit, one output circuit has a scanning signal line, a first transistor which controls electrical connection between the scanning signal line and a clock signal line which has a gate connected to a first node, the first node which is at an active potential in a first time period including a time period during which the active potential is output to the scanning signal line, a second transistor which electrically connects the first node and an inactive signal line which has a potential to open the transistor in a second time period other than the first time period, and the second transistor has a gate connected to a second node, wherein the second node has two kinds of timings to be charged for retaining the active potential.

6 Claims, 11 Drawing Sheets

DRIVING CIRCUIT AND DISPLAY DEVICE USING MULTIPLE PHASE CLOCK SIGNALS

CROSS-REFERENCE TO RELATED APPLICATION

The present application claims priority from Japanese application JP2011-193730 filed on Sep. 6, 2011, the content of which is hereby incorporated by reference into this application.

BACKGROUND OF THE INVENTION

1. Field of the Invention

The present invention relates to a driving circuit and a display device using the driving circuit.

2. Description of the Related Art

As a display devices for an information communication terminal, such as a computer, or a television receiver, liquid crystal display device has been widely used. Moreover, organic EL display device (OLED), field emission display device (FED), and the like have also been known as flat-panel display devices. The liquid crystal display device is a device which changes the alignment of a liquid crystal material sealed between two substrates by changing an electric field to control the degree of transmittance of light passing through the two substrates and the liquid crystal material, thereby displaying an image.

In display devices which apply a voltage corresponding to a certain gray scale value to each pixel of a screen, including the liquid crystal display device described above, each pixel has a pixel transistor for applying the voltage corresponding to the gray scale value. In general, gates of pixel transistors corresponding to one line of the screen are connected to one signal line (hereinafter referred to as "scanning signal line"). This scanning signal line is controlled by a driving circuit so as to output an active voltage which makes the pixel transistors conductive sequentially for each line. JP 2007-095190 A shows an example of a driving circuit which can operate more stably without the occurrence of a short-circuit current.

SUMMARY OF THE INVENTION

FIG. 16 shows an output circuit 910 for outputting to a scanning signal line $G_n$, as an example of one of a plurality of output circuits included in a driving circuit. FIG. 17 is a timing diagram of operation of the output circuit 910 of FIG. 16. $V_n$ represents a clock signal, and the potential of VGPL is fixed to Low potential. The clock signal $V_n$ is an eight-phase clock signal which includes eight clock signals having the same period but different in timing. In this circuit, a scanning signal line $G_{n-2}$ being at High potential is used as a trigger to change potentials of nodes N1 and N2, and High potential of the clock signal $V_n$ is output to the scanning signal line $G_n$.

FIG. 18 schematically shows a detailed change in voltage of the node N2 at the time of operating the output circuit 910. It is necessary for the node N2 to be maintained at High potential for setting a transistor T2 conductive in a time period in which High potential is not output to the scanning signal line $G_n$. However, leakage occurs from transistors T3, T4, and T7 to cause a gradual decrease in potential. To compensate for this, the node N2 is charged via the transistor T3, which is diode-connected, at a timing at which a clock signal $V_{n+4}$ is at High potential, thereby High potential of the node N2 is maintained.

In the output circuit of the driving circuit described above, it is considered to use a clock having more phases to lower the frequency of the clock signal $V_n$ in order to decrease the number of times of charging and discharging of a transistor T5 due to a change in potential on a drain side of the transistor T5. For example, FIG. 19 shows a timing diagram where a 16-phase clock is used for the clock signal $V_n$ of the output circuit 910 described above. In this case, since the interval of the clock signal $V_{n+4}$ is increased, opportunities to perform charging to the node N2 are decreased, so that the potential of the node N2 may not be maintained as shown in FIG. 20.

The invention has been made in view of the circumstances described above, and it is an object of the invention to provide a display device with high display quality in which a stable scanning signal is output even when a clock having more phases is used.

According to an exemplary embodiment of the present invention, there is provided a driving circuit of a display device, the driving circuit outputting an active potential sequentially to a plurality of scanning signal lines, the active potential setting a transistor conductive. The driving circuit includes: a plurality of output circuits electrically connected respectively to the plurality of scanning signal lines, wherein one output circuit of the plurality of output circuits has a first transistor which controls electrical connection between one scanning signal line of the plurality of scanning signal lines and a clock signal line, a first node which is connected to a gate of the first transistor and is at the active potential in a first time period including a time period during which the active potential is output to the scanning signal line, a second transistor which controls to connect the first node and an inactive signal line electrically in a second time period other than the first time period, the inactive signal which retains an inactive potential which does not set the transistor conductive, and a second node which is connected to a gate of the second transistor, and the second node has two kinds of charging timings for retaining the active potential.

Moreover, in the driving circuit according to the exemplary embodiment of the invention, the one output circuit further may have a first charging line which connects the second node via an element having a rectifying action and a second charging line which connects the second node via an element having a rectifying action in order to retain the active potential of the second node.

Moreover, in the driving circuit according to the exemplary embodiment of the invention, one clock signal of a plurality of clock signals which have the same cycle and which are input to the plurality of output circuits may be input to any one of the first charging line and the second charging line, and one scanning signal line of another output circuit of the plurality of output circuits may be connected to the other of the first charging line and the second charging line.

Moreover, in the driving circuit according to the exemplary embodiment of the invention, the one clock signal may be a clock signal of the plurality of clock signals which have the same cycle and which are input to the plurality of output circuits, the clock signal being at an active voltage during a period corresponding to half-cycle before a timing at which a clock signal to be input to the clock signal line connected to the first transistor is at the active voltage. The term "cycle" of the half-cycle used herein means a cycle of the clock signal.

Moreover, in the driving circuit according to the exemplary embodiment of the invention, the one scanning signal line of the another output circuit may be input to any one output of three outputs which are sequentially output by the plurality of output circuits immediate after outputting to the scanning signal line of the one output circuit.

Moreover, in the driving circuit according to the exemplary embodiment of the invention, two different clock signals of a plurality of clock signals which have the same cycle and which are input to the plurality of output circuits may be input to the first charging line and the second charging line.

Another exemplary embodiment of the invention is directed to a display device having a plurality of pixels in a screen, including: the driving circuit according to any of the driving circuits described above; and pixel transistors arranged respectively in the plurality of pixels for retaining a voltage based on a gray scale value in each of the plurality of pixels, wherein the scanning signal lines of the driving circuit are each connected to gates of the pixel transistors of the pixels corresponding to one row of the screen.

DETAILED DESCRIPTION OF THE INVENTION

Figure 1:
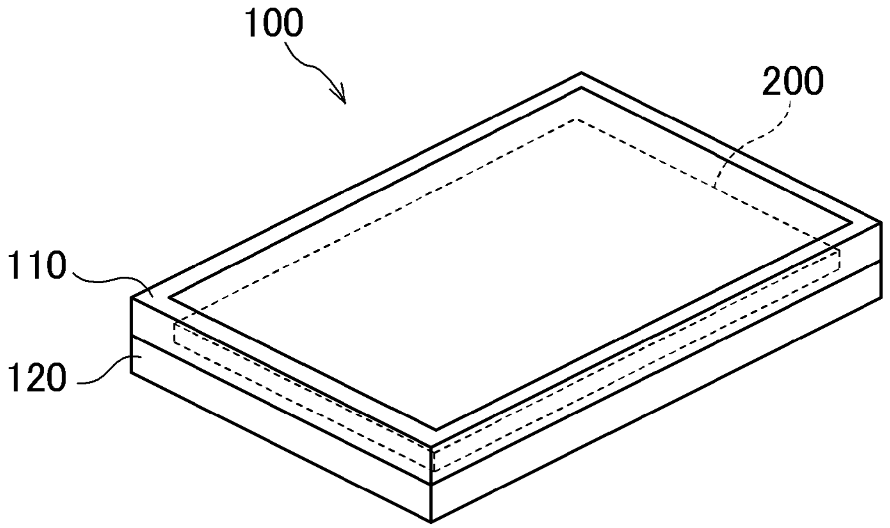
FIG. 1 schematically shows a display device according to a first embodiment of the invention.

Hereinafter, first to fourth embodiments of the invention will be described with reference to the drawings. In the drawing, the same or equivalent constituents are denoted by the same reference characters, and the repetitive description thereof is omitted.

First Embodiment

FIG. 1 schematically shows a display device 100 according to a first embodiment of the invention. As shown in this drawing, the display device 100 includes a display panel 200 fixed so as to be interposed between an upper frame 110 and a lower frame 120. In the embodiment, the display panel 200 is deemed to be a liquid crystal display panel.

Figure 2:
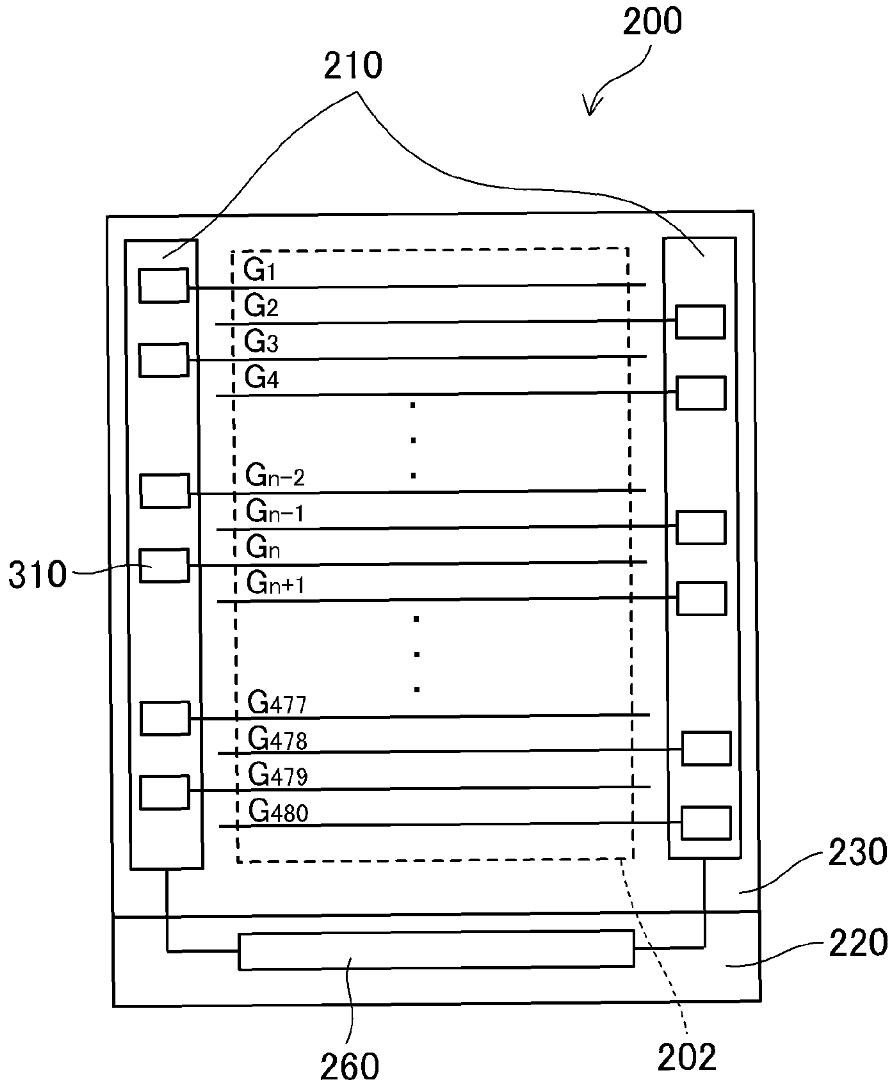
FIG. 2 shows a configuration of a display panel of FIG. 1.

FIG. 2 shows a configuration of the display panel 200 of FIG. 1. The display panel 200 has two substrates, a TFT (Thin Film Transistor) substrate 220 and a color filter substrate 230. Between these substrates, a liquid crystal material is sealed. The TFT substrate 220 has driving circuits 210 arranged on both sides of a display area 202 and a driving IC (Integrated Circuit) 260 controlling the driving circuits 210. The driving circuits 210 applies a predetermined voltage sequentially to scanning signal lines $G_1$ to $G_{480}$. The driving IC 260 applies a voltage corresponding to the gray scale value of a pixel to a plurality of data signal lines (not shown) extending so as to perpendicularly intersect the scanning signal lines $G_1$ to $G_{480}$ in the display area 202. Moreover, the driving circuit 210 has output circuits 310 respectively connected to the scanning signal lines $G_n$ (n=1 to 480). The output circuits 310 on one side of the display area 202 control odd-numbered scanning signal lines $G_n$ (n: odd numbers), while the output circuits 310 on the other side control even-numbered scanning signal lines $G_n$ (n: even numbers).

Figure 3:
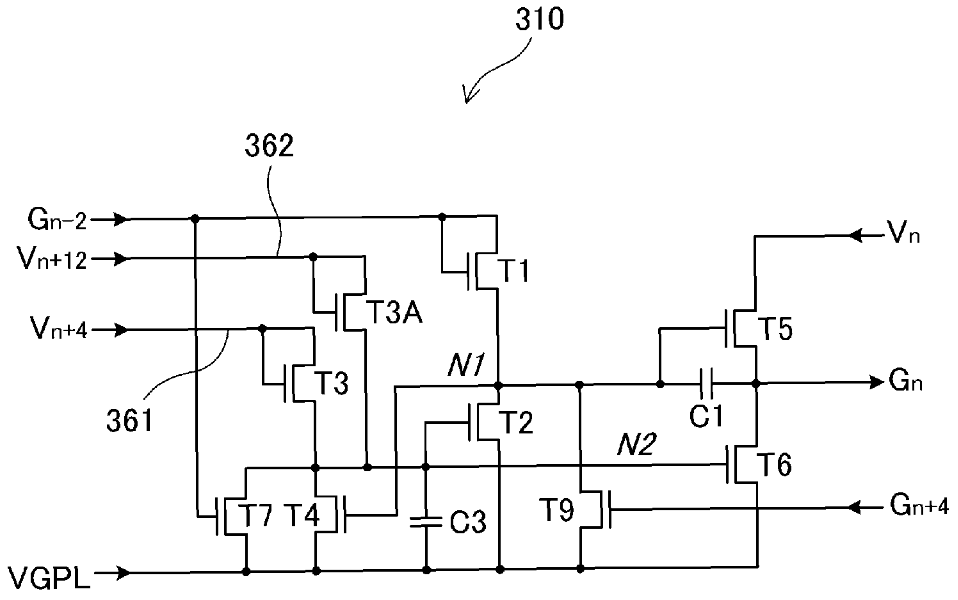
FIG. 3 shows a circuit configuration of an output circuit of FIG. 2.
Figure 4:
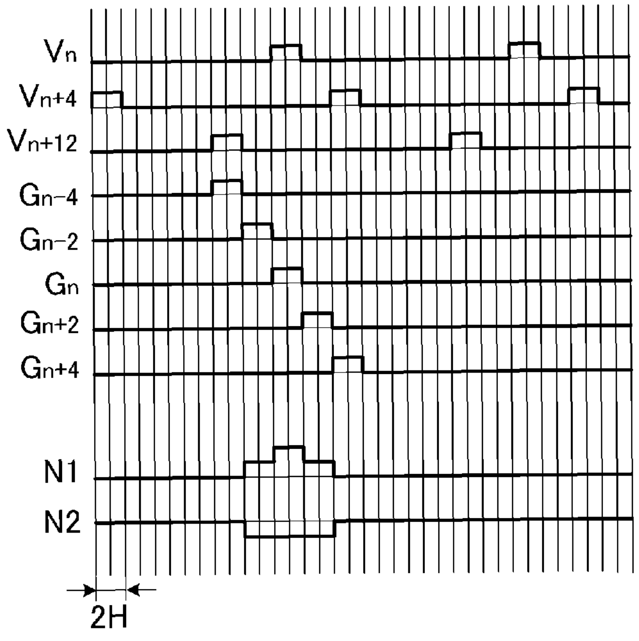
FIG. 4 is a timing diagram of operation of the output circuit of FIG. 3.

FIG. 3 shows a circuit configuration of the output circuit 310, and FIG. 4 is a timing diagram of operation of the output circuit 310 of FIG. 3. The output circuit 310 operates with a 16-phase clock signal which includes 16 clock signals having the same cycle but different in timing. Since the driving circuit which drives the even-numbered scanning signal lines and the driving circuit which drives the odd-numbered scanning signal lines are respectively arranged on both sides of the display area 202, one driving circuit 210 arranged on one side of the display area 202 operates substantially with an 8-phase clock.

Next, operation of the output circuit 310 will be described. Here, $V_n$ represents a clock signal, and the potential of VGPL is fixed to Low potential. All of these signals are input from the outside of the output circuit 310. First, when a scanning signal line $G_{n-2}$ is at High potential, a gate of a transistor T7 is at High potential, so that the transistor T7 becomes conductive. Therefore, a node N2 is connected to VGPL to be at Low potential. Moreover, the scanning signal line $G_{n-2}$ is also input to a diode-connected transistor T1. Therefore, a node N1 connected to the transistor T1 is at High potential (active potential), so that a potential difference is generated at a capacitance C1 and a transistor T5 becomes conductive. Since the node N1 serves as the gate signal of a transistor T4, the node N2 is connected to VGPL also through the transistor T4 to be at Low potential.

Next, when the clock signal $V_n$ is at High potential, the potential of one of electrodes of the capacitance C1 becomes High potential because the transistor T5 is conductive, so that the gate potential of the transistor T5 which is at the side of the other electrode of the capacitance C1 is further raised due to so-called bootstrap. This ensures High potential of the scanning signal line $G_n$. In a writing time period during which the scanning signal line $G_n$ is at High potential, a data signal voltage based on the gray scale value of each pixel is applied to each of the data signal lines (not shown), and the applied voltage based on the gray scale value is retained in the pixel due to the drop of the scanning signal line $G_n$, which will be described later.

When the clock signal $V_n$ is at Low potential, the scanning signal line $G_n$ is also at Low potential. However, for further ensuring this, a clock signal $V_{n+4}$ which is at High potential is input to a diode-connected transistor T3, so that the node N2 is at High potential. A transistor T6 whose gate is connected with the node N2 at High potential connects the scanning signal line $G_n$ and VGPL electrically, so that the scanning signal line $G_n$ is at Low potential. On the other hand, High potential of a scanning signal line $G_{n+4}$ after two horizontal driving periods is input to a gate of a transistor T9 so as to connects the node N1 and VGPL electrically, so that the node N1 is at Low potential.

Figure 5:
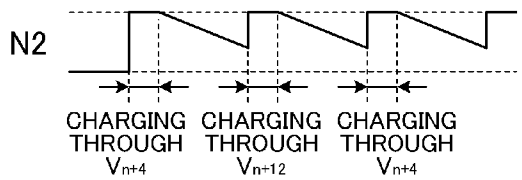
FIG. 5 schematically shows a detailed change in potential of a node N2 in operation of the output circuit of FIG. 3.

Here, in the embodiment, the output circuit 310 has a first charging line 361 and a second charging line 362. Here, the first charging line 361 is connected to the node N2 via the diode-connected transistor T3 acting as a rectifying element, and the clock signal $V_{n+4}$ is applied to the first charging line 361. Moreover, the second charging line 362 is connected to the node N2 via a diode-connected transistor T3A, and a clock signal $V_{n+12}$ is applied to the second charging line 362. Accordingly, as shown in FIG. 5, charging is performed using not only the clock signal $V_{n+4}$ but also the clock signal $V_{n+12}$ which is at High potential in a time period during which the clock signal $V_{n+4}$ is at Low potential. Therefore, High potential of the node N2 can be maintained, and the driving circuit can output a more stable scanning signal, so that the display quality of the display device can be enhanced. Here, although the clock signal to be applied to the second charging line 362 is the clock signal $V_{n+12}$, any clock signal may be used as long as the clock signal is at an active potential in a time period of one-half cycle before the clock signal $V_n$ is at High potential (active potential).

Second Embodiment

Figure 6:
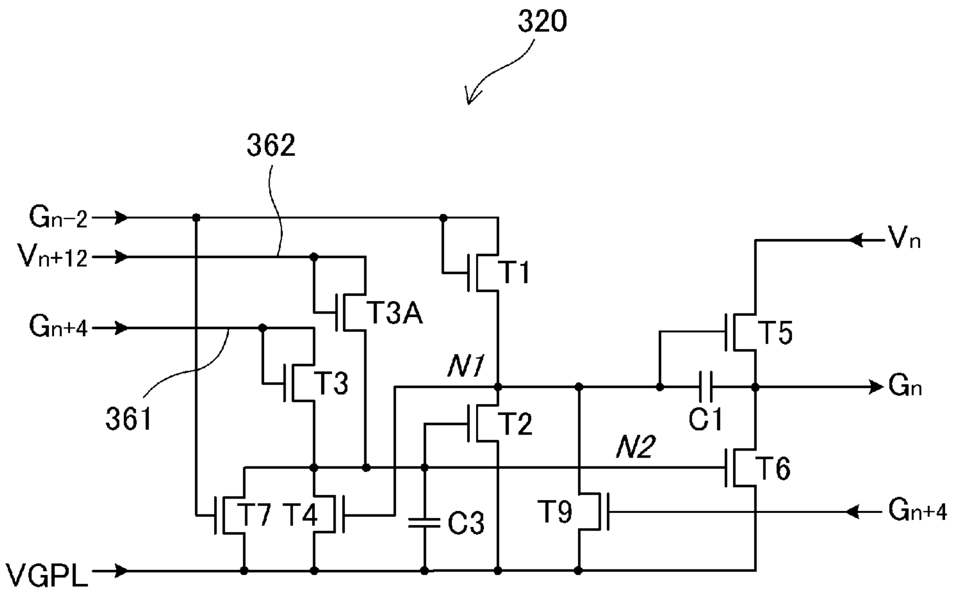
FIG. 6 shows a configuration of an output circuit according to a display device of a second embodiment.

A second embodiment of the invention will be described. Since a configuration of a display device according to the second embodiment is similar to that of the first embodiment shown in FIGS. 1 and 2, the repetitive description thereof is omitted. FIG. 6 shows a configuration of an output circuit 320 according to the display device of the second embodiment. The output circuit 320 is different from the output circuit 310 in the first embodiment in that the signal to be input to the transistor T3 is not the clock signal $V_{n+4}$ but output of the scanning signal line $G_{n+4}$.

Figure 7:
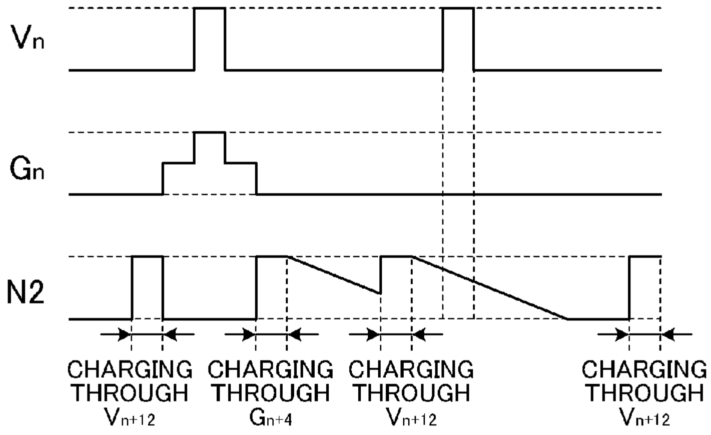
FIG. 7 schematically shows a detailed change in potential of the node N2 in operation of the output circuit of FIG. 6.

FIG. 7 schematically shows a detailed timing of operation using the output circuit of FIG. 6. It is sufficient that High potential of the node N2 not to set the transistor T5 conductive is maintained when the clock signal $V_n$ is at High potential. Therefore, as shown in FIG. 7, it is basically sufficient that charging is performed at a timing that the clock signal $V_{n+12}$ is input to the second charging line 362. However, since it is necessary to lower the node N2 to Low potential at a timing after outputting to the scanning signal line $G_n$, output of the scanning signal line $G_{n+4}$ which is at High potential once in a vertical synchronizing period is applied to the first charging line 361. This almost eliminates charging to the node N2 at a timing other than the clock signal $V_{n+12}$. Therefore, for example, loads to the transistors T2 and T6 are decreased, so that the occurrence of threshold voltage shift or the like can be suppressed, and High potential of the node N2 can be maintained when the clock signal $V_n$ is at High potential. Accordingly, the driving circuit can output a more stable scanning signal, so that the display quality of the display device can be enhanced.

Third Embodiment

Figure 8:
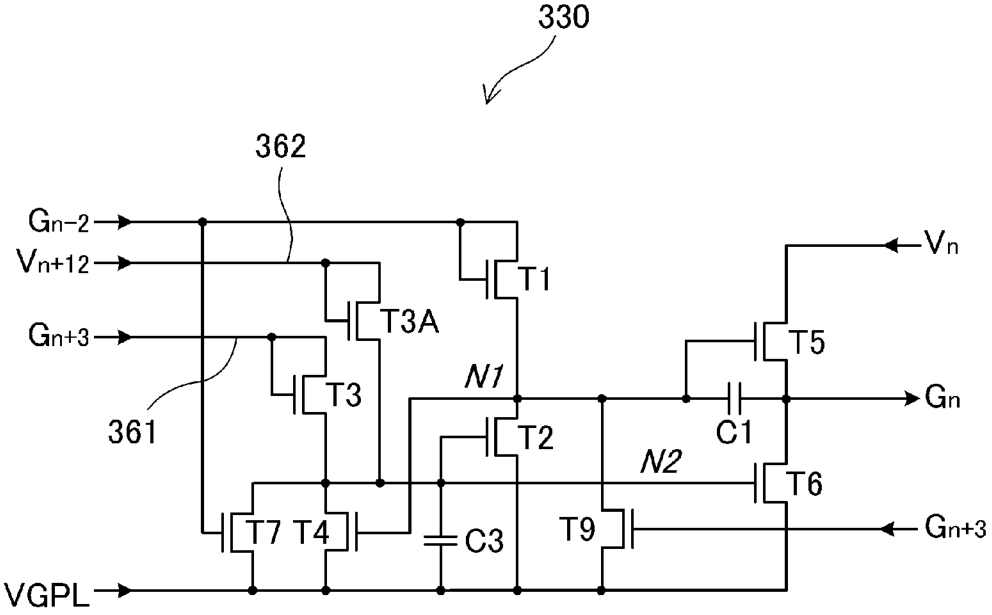
FIG. 8 shows a configuration of an output circuit according to a display device of a third embodiment.

A third embodiment of the invention will be described. Since a configuration of a display device according to the third embodiment is similar to that of the first embodiment shown in FIGS. 1 and 2, the repetitive description thereof is omitted. FIG. 8 shows a configuration of an output circuit 330 according to the display device of the third embodiment. The output circuit 330 is different from the output circuit 320 in the second embodiment in that the signal to be input to the first charging line 361 and the gate of the transistor T9 is not the output of the scanning signal line $G_{n+4}$ but output of a scanning signal line $G_{n+3}$.

Figure 9:
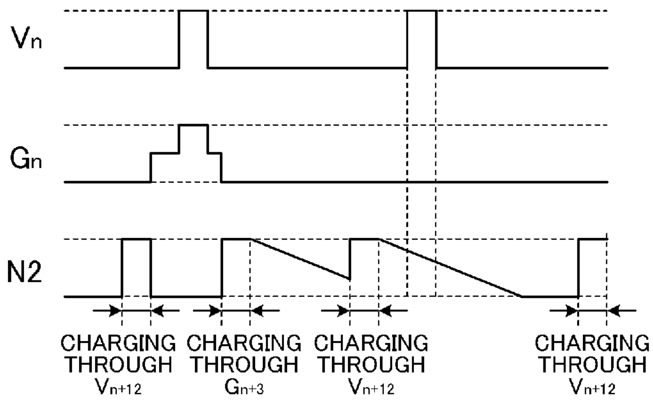
FIG. 9 schematically shows a detailed change in potential of the node N2 in operation of the output circuit of FIG. 8.

FIG. 9 schematically shows a timing of operation using the circuit of FIG. 8. Similar to the second embodiment, the output of the scanning signal line $G_{n+3}$ which is at High potential once in a vertical synchronizing time period is applied to the first charging line 361. However, since the scanning signal line $G_{n+3}$ is at High potential at a timing one step earlier than the scanning signal line $G_{n+4}$ it is possible to raise the node N2 to High potential as shown in FIG. 9, that is, lower the node N1 to Low potential. This makes it possible to shorten a period during which the gate voltage of the transistor T5 relating directly to the output of the scanning signal line $G_n$ is high, so as to suppress threshold voltage shifting of the transistor T5. Moreover, since the node N2 is rarely charged during a period in which the clock signal $V_{n+12}$ is not provided, loads to the transistors T2 and T6 are also decreased, so that the occurrence of threshold voltage shift or the like can be suppressed also for these transistors. Moreover, since High potential of the node N2 can be maintained when the clock signal $V_n$ is at High potential, the driving circuit can output a more stable scanning signal, so that the display quality of the display device can be enhanced. Here, although output of the scanning signal line to be applied to the first charging line 361 is the output of the scanning signal line $G_{n+3}$, the output may be any one of three outputs of the other scanning signal lines immediately after the output of the scanning signal line $G_n$.

Fourth Embodiment

Figure 10:
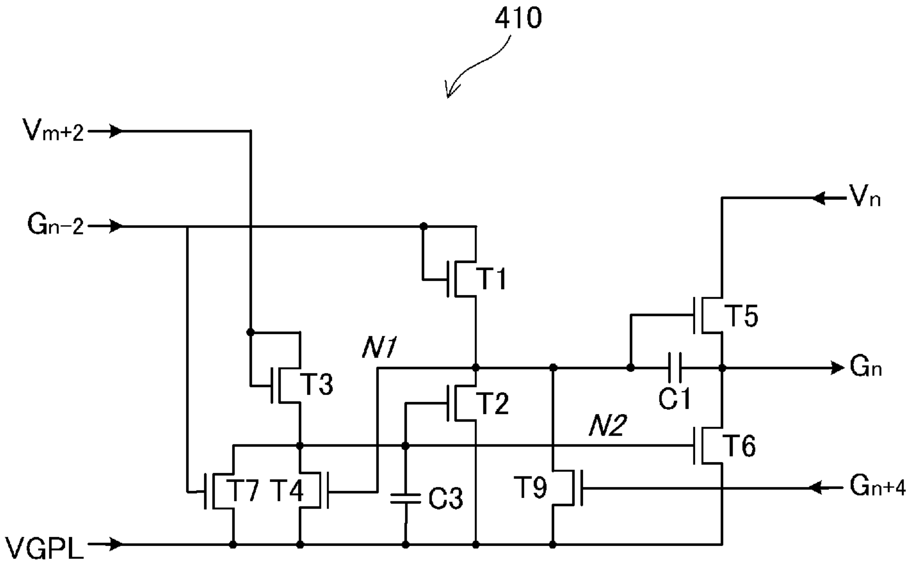
FIG. 10 shows a configuration of an output circuit according to a display device of a fourth embodiment.
Figure 11:
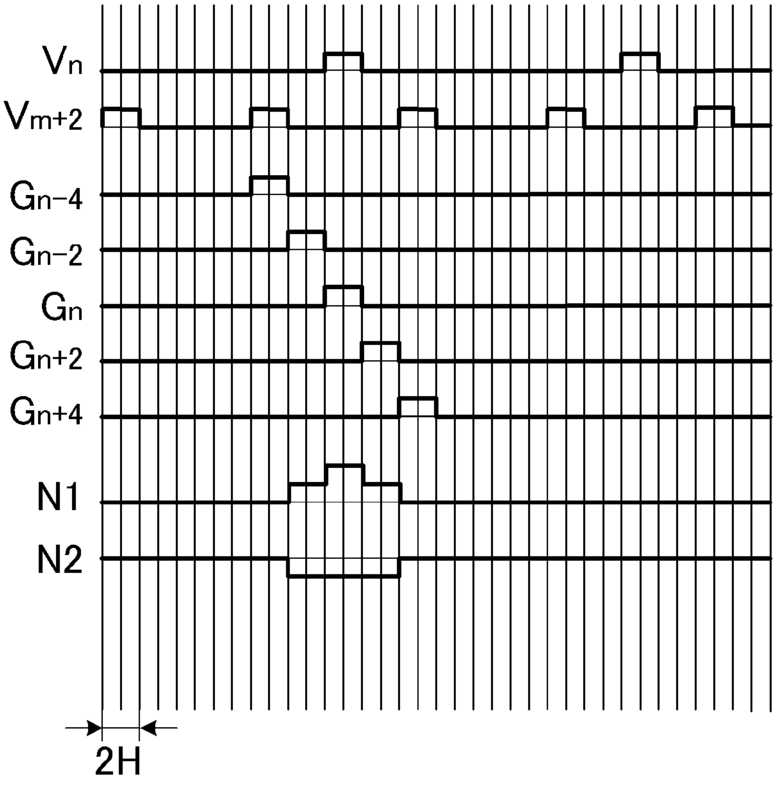
FIG. 11 is a timing diagram of operation of the output circuit of FIG. 10.
Figure 12:
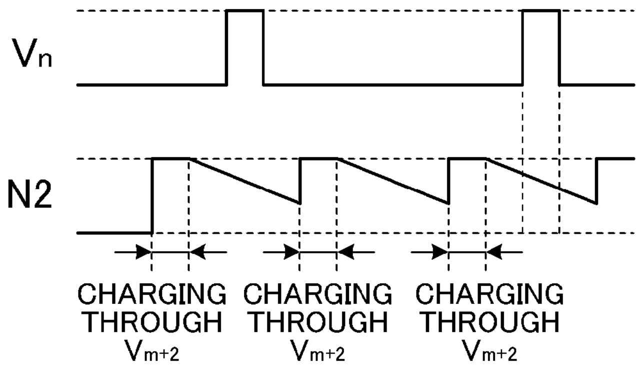
FIG. 12 schematically shows a detailed change in potential of the node N2 in operation of the output circuit of FIG. 10.

Since a configuration of a display device according to a fourth embodiment is similar to that of the first embodiment shown in FIGS. 1 and 2, the repetitive description thereof is omitted. FIG. 10 shows a configuration of an output circuit 410 according to the display device of the fourth embodiment. Moreover, FIG. 11 shows a timing diagram of operation using the output circuit 410. The output circuit 410 is different from the output circuit 310 in the first embodiment in that the diode-connected transistor T3A is not used, and that an 8-phase clock signal $V_{m+2}$ is input to the transistor T3. Even with the configuration described above, since High potential of the node N2 can be maintained as shown in FIG. 12, the driving circuit can output a more stable scanning signal, so that the display quality of the display device can be enhanced.

Figure 13:
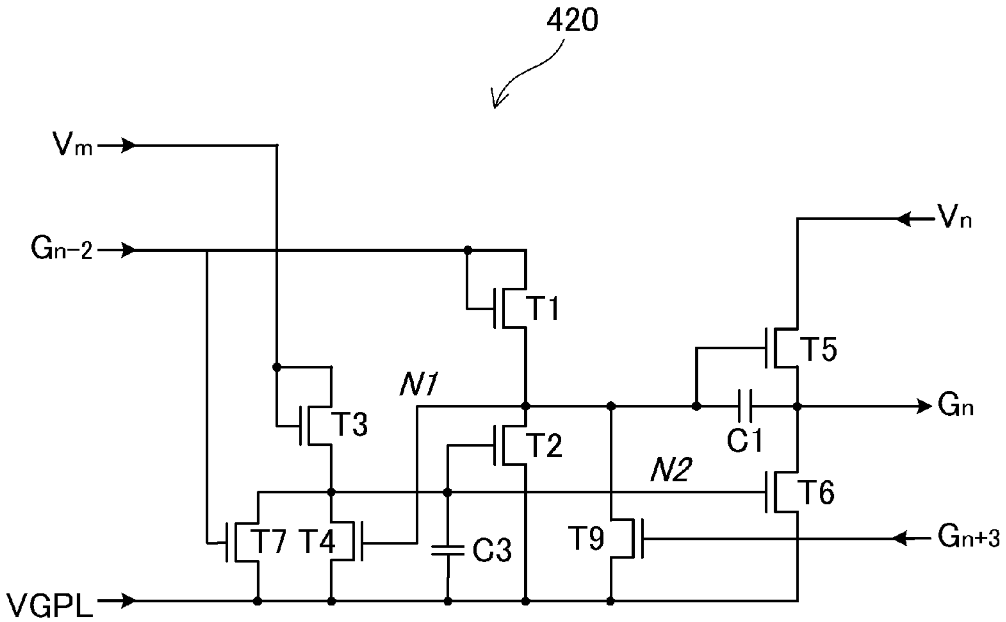
FIG. 13 shows an output circuit as a modified example of the output circuit of FIG. 10.
Figure 14:
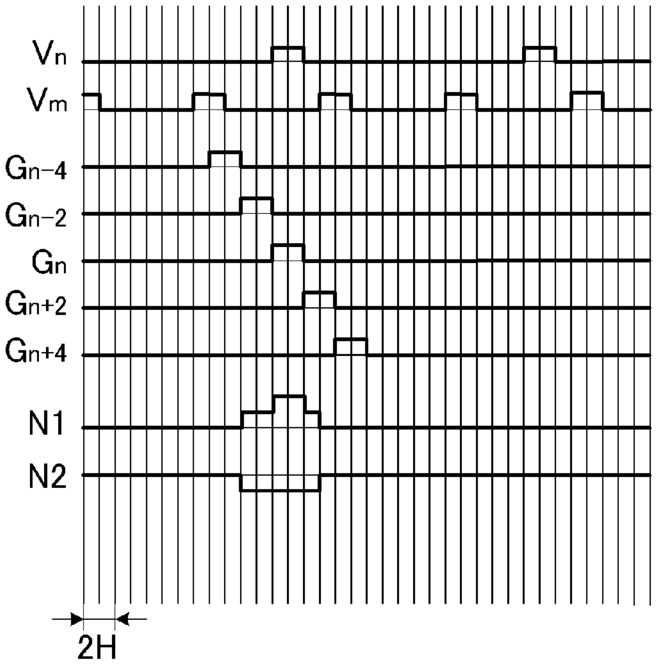
FIG. 14 is a timing diagram of operation of the output circuit of FIG. 13.
Figure 15:
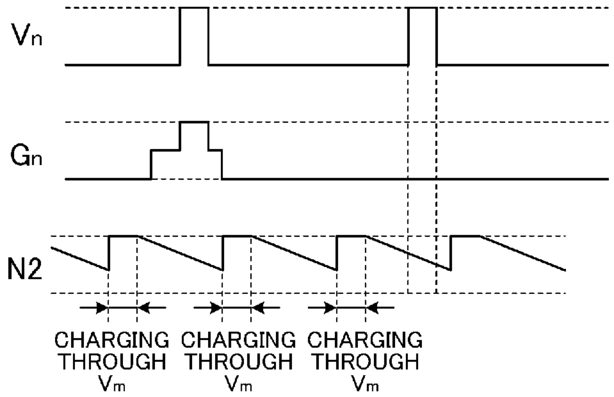
FIG. 15 schematically shows a detailed change in potential of the node N2 in operation of the output circuit of FIG. 13.
Figure 16:
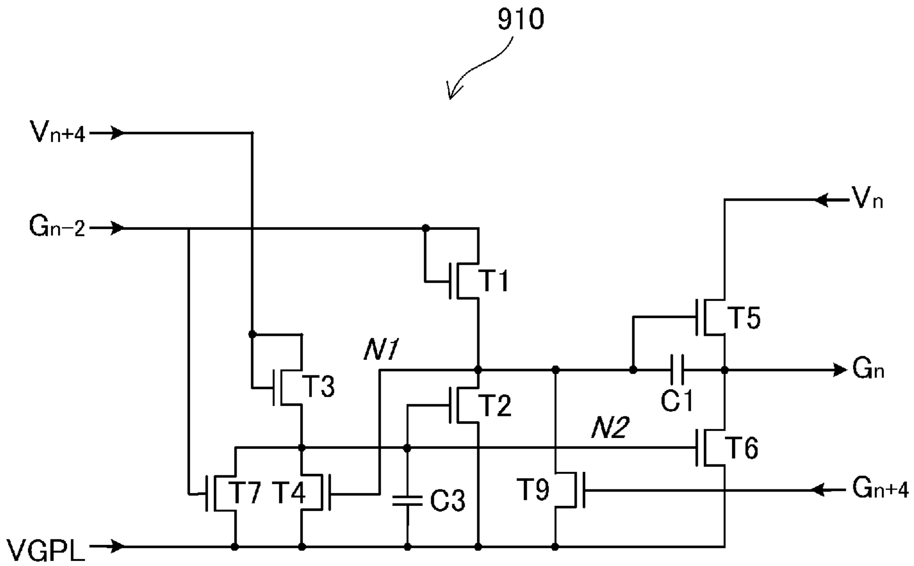
FIG. 16 shows an example of an output circuit.
Figure 17:
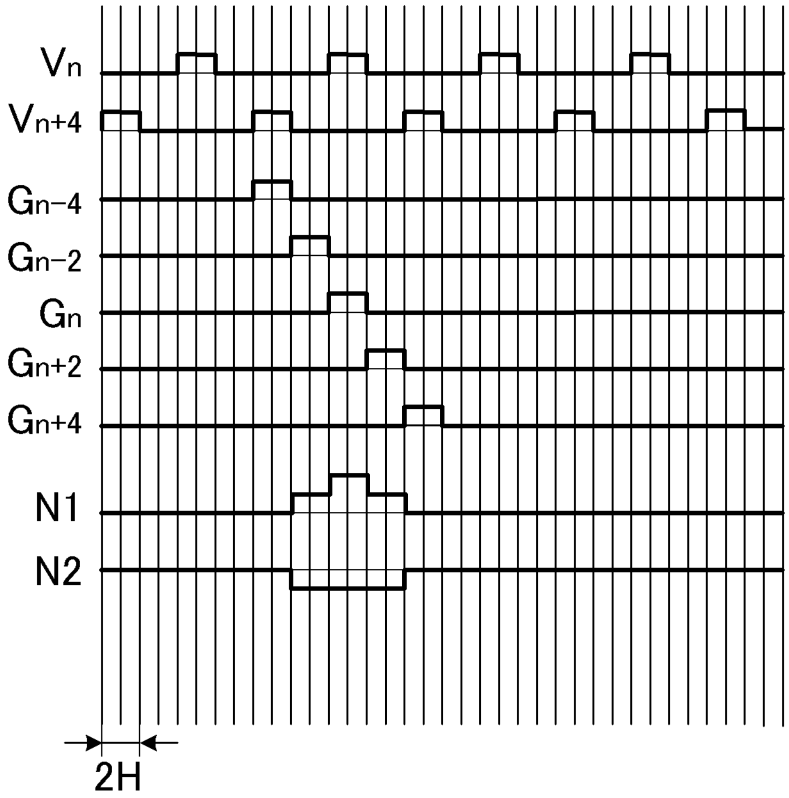
FIG. 17 is a timing diagram of operation of the output circuit of FIG. 16.
Figure 18:
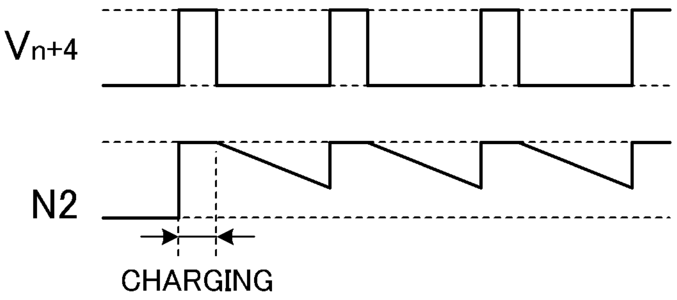
FIG. 18 schematically shows a detailed change in potential of the node N2 in operation of the output circuit of FIG. 16.
Figure 19:
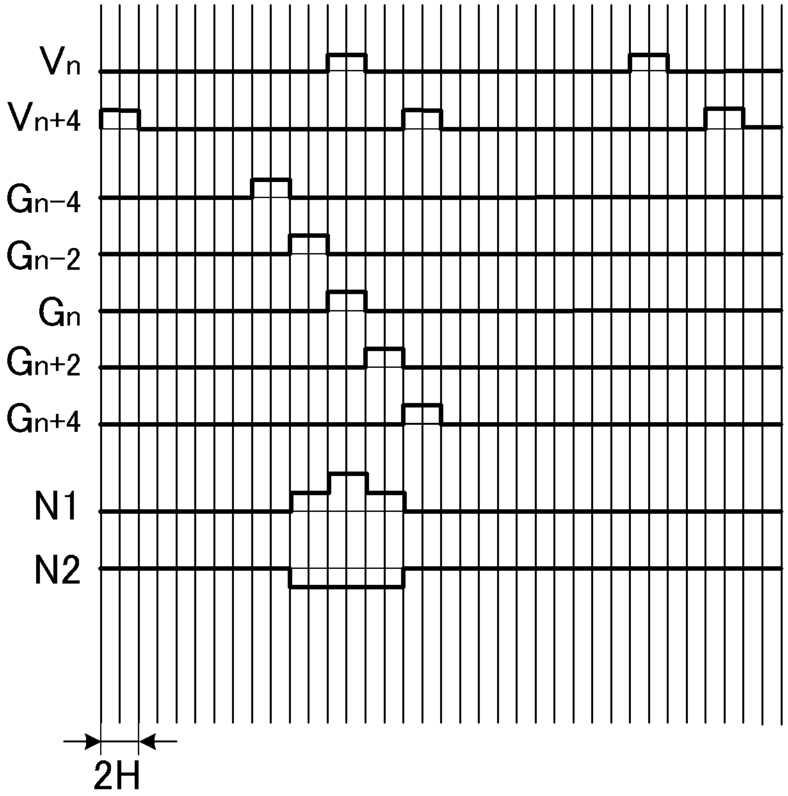
FIG. 19 is a timing diagram where a 16-phase clock is used.
Figure 20:
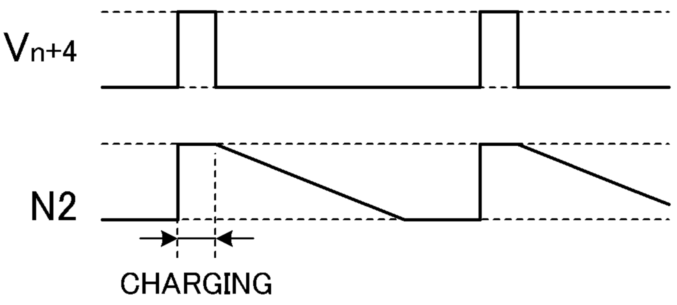
FIG. 20 schematically shows a detailed change in potential of the node N2 in the case of FIG. 19.

FIG. 13 shows an output circuit 420 as a modified example of the output circuit 410, and FIG. 14 shows a timing diagram of operation of the output circuit 420. The output circuit 420 is different from the output circuit 410 in that the 8-phase clock signal to be input to the diode-connected transistor T3 is a clock signal $V_m$ which is different from the clock signal $V_{m+2}$ in timing, and that the signal to be input to the gate of the transistor T9 is an output signal to the scanning signal line $G_{n+3}$. In the case of the configuration described above, High potential of the node N1 can be lowered earlier as shown in FIG. 15, and a period during which the gate voltage of the transistor T5 is high and is relating directly to the output of the scanning signal line $G_n$ can be reduced, so as to suppress threshold voltage shifting of the transistor T5. Moreover, since High potential of the node N2 can be maintained, the driving circuit can output a more stable scanning signal, so that the display quality of the display device can be enhanced.

Moreover, although, in each of the display devices of the embodiments described above, an 8-phase or 16-phase clock signal is used, a clock signal other than these can also be used.

Moreover, the liquid crystal display device of each of the embodiments described above is not limited to a liquid crystal display device. The embodiments can be used for organic EL display devices, field emission display devices (FEDs), and other display devices using a shift register as a driving circuit.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A driving circuit of a display device, the driving circuit being configured to output an active potential sequentially to a plurality of scanning signal lines, the active potential setting a transistor conductive, the driving circuit comprising:

a plurality of output circuits electrically connected respectively to the plurality of scanning signal lines, wherein one output circuit of the plurality of output circuits includes:

a first transistor which controls electrical connection between one scanning signal line of the plurality of scanning signal lines and a clock signal line, a first node which is connected to a gate of the first transistor and is at the active potential in a first time period including a time period during which the active potential is output to the scanning signal line, a second transistor which controls to connect the first node and an inactive signal line electrically in a second time period other than the first time period, wherein the inactive signal retains an inactive potential which does not set the transistor conductive, and a second node which is connected to a gate of the second transistor, wherein the second node is charged at first and second charging times for retaining the active potential, wherein the clock signal line is configured to supply a first clock signal, further comprising:

a first charging line which is connected to the second node and which is configured to supply a second clock signal, a second charging line which is connected to the second node and which is configured to supply a third clock signal, wherein each of the first, second and third clock signals is one of 8-phase clock signals and wherein all of the first, second and third clock signals have a same period and a different phase from each other, wherein the second clock signal charges the second node at the first charging time, and wherein the third clock signal charges the second node at the second charging time.

2. The driving circuit according to claim 1, wherein the first charging line connects the second node via an element having a rectifying action and the second charging line connects the second node via an element having a rectifying action in order to retain the active potential of the second node.

3. The driving circuit according to claim 2, wherein one scanning signal line of another output circuit of the plurality of output circuits is connected to the first charging line or the second charging line.

4. The driving circuit according to claim 3, wherein the first or second clock signal is at an active voltage during a period corresponding to half-cycle before a timing at which a clock signal to be input to the clock signal line connected to the first transistor is at the active voltage.

5. The driving circuit according to claim 3, wherein the one scanning signal line of the another output circuit is input to any one output of three outputs which are sequentially output by the plurality of output circuits immediate after outputting to the scanning signal line of the one output circuit.

6. A display device having a plurality of pixels in a screen, comprising:

the driving circuit according to claim 1; and pixel transistors arranged respectively in the plurality of pixels for retaining a voltage based on a gray scale value in each of the plurality of pixels, wherein the scanning signal lines of the driving circuit are each connected to gates of the pixel transistors of the pixels corresponding to one row of the screen.

* * * * *